United States Patent
Zhou et al.

(10) Patent No.: US 7,993,700 B2
(45) Date of Patent: Aug. 9, 2011

(54) SILICON NITRIDE PASSIVATION FOR A SOLAR CELL

(75) Inventors: Lisong Zhou, Sunnyvale, CA (US); Sangeeta Dixit, Mountain View, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 191 days.

(21) Appl. No.: 11/734,742

(22) Filed: Apr. 12, 2007

(65) Prior Publication Data

US 2008/0254203 A1 Oct. 16, 2008

Related U.S. Application Data

(60) Provisional application No. 60/892,511, filed on Mar. 1, 2007.

(51) Int. Cl.
 *B05D 5/12* (2006.01)
(52) U.S. Cl. ......... 427/74; 427/58; 427/248.1; 427/569; 118/715
(58) Field of Classification Search .............. 427/58, 427/74, 248.1, 569; 118/715
See application file for complete search history.

(56) References Cited

U.S. PATENT DOCUMENTS

| | | | | |
|---|---|---|---|---|
| 4,363,828 A | * | 12/1982 | Brodsky et al. | 438/485 |
| 5,030,295 A | | 7/1991 | Swanson et al. | |
| 5,069,930 A | * | 12/1991 | Hussla et al. | 427/588 |
| 5,582,880 A | * | 12/1996 | Mochizuki et al. | 427/569 |
| 5,942,049 A | * | 8/1999 | Li et al. | 136/258 |
| 7,090,705 B2 | * | 8/2006 | Miyazaki et al. | 29/25.01 |
| 2003/0049558 A1 | * | 3/2003 | Aoki et al. | 430/128 |
| 2004/0080009 A1 | * | 4/2004 | Sandhu et al. | 257/437 |
| 2005/0176221 A1 | * | 8/2005 | Yamazaki et al. | 438/507 |
| 2006/0105106 A1 | * | 5/2006 | Balseanu et al. | 427/248.1 |
| 2006/0255340 A1 | | 11/2006 | Manivannan et al. | |
| 2007/0001236 A1 | | 1/2007 | Yamazaki et al. | |
| 2007/0046191 A1 | * | 3/2007 | Saito | 313/506 |
| 2007/0082507 A1 | * | 4/2007 | Iyer et al. | 438/795 |
| 2007/0137692 A1 | * | 6/2007 | Carlson | 136/252 |

FOREIGN PATENT DOCUMENTS

WO   WO-2008107156 A2   9/2008

OTHER PUBLICATIONS

PCT International Search Report and Written Opinion dtd Jul. 30, 2010 for International Application No. PCT/US2008/059674.

* cited by examiner

*Primary Examiner* — Shamim Ahmed
(74) *Attorney, Agent, or Firm* — Patterson & Sheridan, L.L.P.

(57) ABSTRACT

A silicon nitride layer may be formed with a suitable refractive index, mass density, and hydrogen concentration so that the layer may serve as an ARC/passivation layer on a solar cell substrate. The silicon nitride layer may be formed on a solar cell substrate by adding a hydrogen gas diluent to a conventional precursor gas mixture during the deposition process. Alternatively, the silicon nitride layer may be formed on a solar cell substrate by using a precursor gas mixture consisting essentially of silane and nitrogen. To improve deposition chamber throughput, the silicon nitride layer may be a dual stack film that includes a low-hydrogen interface layer and a thicker bulk silicon nitride layer. Placing a plurality of solar cell substrates on a substrate carrier and transferring the substrate carrier into the deposition chamber may further enhance deposition chamber throughput.

14 Claims, 9 Drawing Sheets

SILICON NITRIDE PASSIVATION FOR A SOLAR CELL

CROSS REFERENCE TO RELATED APPLICATIONS

This application claims benefit of United States provisional patent application serial number 60/892,511, filed Mar. 1, 2007.

BACKGROUND OF THE INVENTION

1. Field of the Invention

Embodiments of the present invention generally relate to the fabrication of solar cells and particularly to the surface passivation of crystalline silicon solar cells.

2. Description of the Related Art

Solar cells are photovoltaic devices that convert sunlight directly into electrical power. The most common solar cell material is silicon (Si), which is in the form of single or multi-crystalline wafers. Because the cost of electricity generated using silicon-based solar cells is higher than the cost of electricity generated by traditional methods, there has been an effort to reduce the cost of manufacturing solar cells that does not adversely affect the overall efficiency of the solar cell.

FIG. 1 schematically depicts a cross-sectional view of a standard silicon solar cell 100 fabricated from a single crystal silicon wafer 110. The wafer 110 includes a base region 101, which is typically composed of p-type silicon, an emitter region 102, which is typically composed of n-type silicon, a p-n junction region 103, and a dielectric layer 104. P-n junction region 103 is disposed between base region 101 and emitter region 102 of the solar cell, and is the region in which electron-hole pairs are generated when solar cell 100 is illuminated by incident photons. Dielectric layer 104 acts as an anti-reflective coating (ARC) layer for solar cell 100 as well as a passivation layer for the surface 105 of emitter region 102.

When light falls on the solar cell, energy from the incident photons generates electron-hole pairs on both sides of p-n junction region 103. Electrons diffuse across the p-n junction to a lower energy level and holes diffuse in the opposite direction, creating a negative charge on the emitter and a corresponding positive charge build-up in the base. When an electrical circuit is made between the emitter and the base, a current will flow and electricity is produced by solar cell 100. The efficiency at which solar cell 100 converts incident energy into electrical energy is affected by a number of factors, including the recombination rate of electrons and holes in solar cell 100 and the fraction of incident light that is reflected off of solar cell 100.

Recombination occurs when electrons and holes, which are moving in opposite directions in solar cell 100, combine with each other. Each time an electron-hole pair recombines in solar cell 100, charge carriers are eliminated, thereby reducing the efficiency of solar cell 100. Recombination may occur in the bulk silicon of wafer 110 or on either surface 105, 106 of wafer 110. In the bulk, recombination is a function of the number of defects in the bulk silicon. On the surfaces 105, 106 of wafer 110, recombination is a function of how many dangling bonds, i.e., unterminated chemical bonds, are present on surfaces 105, 106. Dangling bonds are found on surfaces 105, 106 because the silicon lattice of wafer 110 ends at these surfaces. These unterminated chemical bonds act as defect traps, which are in the energy band gap of silicon, and therefore are sites for recombination of electron-hole pairs.

Thorough passivation of the surface of a solar cell greatly improves the efficiency of the solar cell by reducing surface recombination. As used herein, "passivation" is defined as the chemical termination of dangling bonds present on the surface of a silicon lattice. In order to passivate a surface of solar cell 100, such as surface 105, a dielectric layer 104 is typically formed thereon, thereby reducing the number of dangling bonds present on surface 105 by 3 or 4 orders of magnitude. For solar cell applications, dielectric layer 104 is generally a silicon nitride ($Si_3N_4$, also abbreviated SiN) layer, and the majority of dangling bonds are terminated with silicon (Si) or nitrogen (N) atoms. But because silicon nitride (SiN) is an amorphous material, a perfect match-up between the silicon lattice of emitter region 102 and the amorphous structure of dielectric layer 104 cannot occur. Hence, the number dangling bonds remaining on surface 105 after the formation of dielectric layer 104 is still enough to significantly reduce the efficiency of solar cell 100, requiring additional passivation of surface 105, such as hydrogen passivation. In the case of multi-crystalline silicon solar cells, hydrogen also helps to passivate the defect centers on the grain boundary.

When dielectric layer 104 is a silicon nitride (SiN) layer, hydrogen passivation of surface 105 is performed by the incorporation of an optimal concentration of hydrogen (H) atoms in the bulk of dielectric layer 104. The optimal hydrogen concentration is a function of numerous factors, including the film properties and the method of depositing dielectric layer 104, but ranges between about 5 atomic % and 20 atomic %. After deposition of dielectric layer 104, solar cell substrates undergo a high-temperature anneal process, sometimes referred to as a "firing process," which forms the metal contacts with the cells. During the firing process, hydrogen atoms present in dielectric layer 104 diffuse from dielectric layer 104 to surface 105, and grain boundaries if multi-crystalline silicon, and terminate many of the remaining dangling bonds present there. It is known in the art that having the optimal concentration of hydrogen atoms in the bulk of dielectric layer 104 is a key factor for enabling an effective hydrogen passivation process. For example, it is estimated that poor hydrogen passivation of surface 105 may reduce the potential efficiency of a solar cell from approximately 14-15% efficiency down to 12-13% efficiency or less.

In addition to surface passivation, the efficiency of solar cell 100 may be enhanced with an ARC layer. When light passes from one medium to another, for example from air to glass, or from glass to silicon, some of the light may reflect off of the interface between the two media, even when the incident light is normal to the interface. The fraction of light reflected is a function of the difference in refractive index between the two media, wherein a greater difference in refractive index results in a higher fraction of light being reflected from the interface. An ARC layer disposed between the two media and having a refractive index whose value is between the refractive indices of the two media is known to reduce the fraction of light reflected. Hence, the presence of an ARC layer on a light-receiving surface of solar cell 100, such as dielectric layer 104 on surface 105, reduces the fraction of incident radiation reflected off of solar cell 100 and which, therefore, cannot not be used to generate electrical energy. Dielectric layer 104 is most effective as an ARC layer when the index of refraction of dielectric layer 104 is equal to the square root of the product of the indices of the two media forming the interface that causes the reflection, in this case glass and silicon. The refractive indices of glass and silicon are about 1.4 and 3.4, respectively, so an ideal ARC layer for a solar cell should have a refractive index of about 2.1. Because the refractive index of SiN is tunable between about 1.8 to 3.0 by modulating process parameters of the SiN deposition process, SiN is suitable as an ARC layer for solar cells.

Because SiN can be used to terminate dangling bonds on a silicon surface, and because it has a refractive index that can be tuned to a desired value, SiN is widely used as a combination ARC layer and passivation layer for solar cell applications. However, issues with SiN deposition on solar cell substrates include low throughput and poor film property uniformity. Throughput, i.e., the rate at which solar cell substrates are processed, directly affects the cost of processing solar cell substrates. Low throughput of a SiN deposition system ultimately increases solar cell cost. Film property non-uniformity, both wafer-to-wafer, i.e., variation between substrates, and within wafer, i.e., film variation across an individual substrate, may affect the performance of solar cells. Namely, sub-optimal uniformity of properties of the SiN film reduces the efficiency of the solar cell.

SUMMARY OF THE INVENTION

In light of the above, embodiments of the present invention generally provide methods for depositing a SiN ARC/passivation layer that may act as a high-quality surface passivation and ARC layer for solar cells. The methods described herein enable the use of deposition systems configured for processing large-area substrates for solar cell processing. According to embodiments of the invention, a SiN layer may be formed with a suitable refractive index, mass density, and hydrogen concentration so that the layer may serve as an ARC/passivation layer on a solar cell substrate.

The method, according to one embodiment, comprises positioning at least one solar cell substrate in a processing chamber, flowing a process gas mixture into the processing chamber, and generating plasma in the chamber to deposit a SiN-containing layer on the substrate. The plasma may be generated by high- or low-frequency RF power. The process gas mixture may include a precursor gas mixture and a hydrogen gas ($H_2$) diluent, the flow rate of the hydrogen gas diluent being substantially equal to or greater than the flow rate of the precursor gas mixture. Alternatively, the process gas mixture may consist essentially of silane ($SiH_4$) and nitrogen ($N_2$). The method may further comprise positioning the at least one substrate between first and second electrodes of the chamber, wherein the first and second electrodes are configured substantially parallel to each other. In addition, the method may further comprise flowing a second process gas mixture into the processing chamber to deposit a second SiN-containing layer on the first SiN-containing layer, wherein the second process gas mixture does not include a hydrogen gas diluent. The SiN layer may be a dual stack film that includes a low-hydrogen interface layer and a thicker bulk SiN layer. Placing a plurality of solar cell substrates on a substrate carrier and transferring the substrate carrier into the deposition chamber may further enhance deposition chamber throughput.

The method, according the another embodiment comprises positioning at least one solar cell substrate in a processing chamber between first and second electrodes, the first and second electrodes being configured substantially parallel to each other, flowing a process gas mixture into the processing chamber, and generating plasma in the chamber to deposit a SiN-containing layer on the substrate. The process gas mixture either (1) includes a precursor gas mixture and a hydrogen gas ($H_2$) diluent, wherein the flow rate of the hydrogen gas diluent is substantially equal to or greater than the flow rate of the precursor gas mixture, or (2) consists essentially of silane ($SiH_4$) and nitrogen ($N_2$). The plasma may be generated by high- or low-frequency RF power. The method may further comprise positioning the at least one substrate between first and second electrodes of the chamber, wherein the first and second electrodes are configured substantially parallel to each other.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Figure 1:
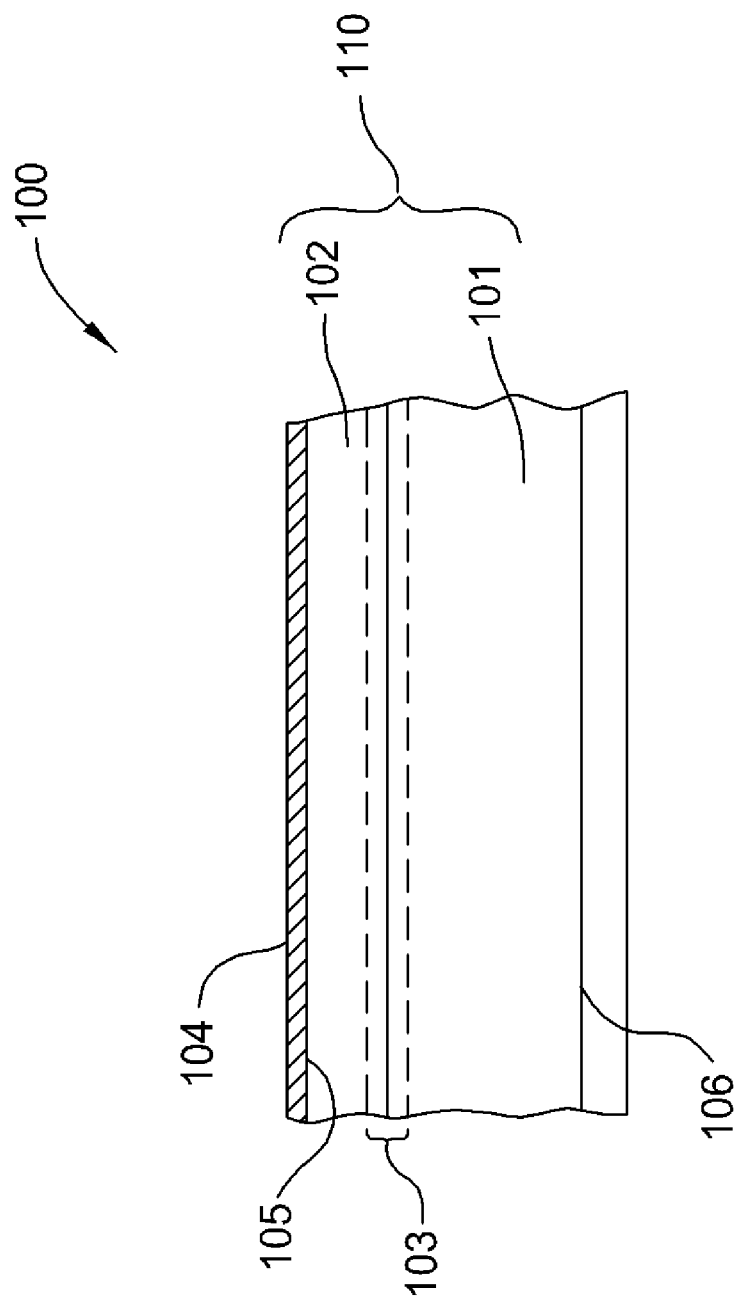
FIG. 1 schematically depicts a cross-sectional view of a standard silicon solar cell fabricated from a single or multi-crystalline silicon wafer.

Plasma-enhanced chemical vapor deposition (PECVD) systems configured for processing large-area substrates can deposit SiN layers with superior film uniformity at high deposition rates. This is particularly true for parallel-plate, high frequency PECVD systems, wherein one or more substrates are positioned between two substantially parallel electrodes in a plasma chamber. The chamber's gas distribution plate generally acts as the first electrode and the chamber's substrate support as the second electrode. A precursor gas mixture is introduced into the chamber, energized into a plasma state by the application of radio frequency (RF) power to one of the electrodes, and flowed across a surface of the substrate to deposit a layer of desired material. As defined herein, "systems configured for processing large-area substrates" refers to processing systems configured for fabricating thin film transistors (TFT's) on large substrates, on the order of about of 1 m², and larger, for example for flat panel displays.

The high deposition rate effected by PECVD systems configured for processing large-area substrates, coupled with the large number of conventional solar cell substrates that can be processed at one time, i.e. 50 or more, may provide a high-throughput method of depositing SiN on solar cell substrates. That is, a large number of solar cell substrates may be processed in a relatively short time, thereby substantially reducing the cost per substrate for SiN deposition. In addition, large-area PECVD systems may enable the processing of unconventional, large area solar cell substrates, such as rectangular substrates on the order of 1 m², and larger. Further, the ability of parallel-plate, high frequency PECVD systems to deposit a highly uniform SiN layer on solar cell substrates may contribute to the performance of solar cells, improving solar cell efficiency.

However, the hydrogenated SiN films deposited by parallel plate, high frequency PECVD systems for large-area substrates have been generally unsuitable for passivation of a solar cell substrate. This is because the hydrogen (H) concentration of these films is too high, e.g., 25 atomic % to 30 atomic % and higher. With such high hydrogen concentration in the SiN passivation film, minority-carrier lifetime, also known as "lifetime," is on the order of 10's of μs for a solar cell, whereas a lifetime of 100's of μs is desired. Lifetime, which is a direct function of the recombination rate of charge carriers, is a quantitative measure of how well a surface or bulk material has been passivated.

The inventors have developed methods of PECVD for depositing a hydrogenated SiN film suitable as a passivation and ARC layer on a solar cell substrate. The methods allow systems configured for processing large-area substrates, such as large-area TFT-processing systems, to perform the deposition of SiN passivation layers on solar cell substrates, thereby taking advantage of the high deposition rate and superior film uniformity of such systems. In particular, a parallel plate, high frequency PECVD system may benefit from the methods described herein.

Figure 2A:
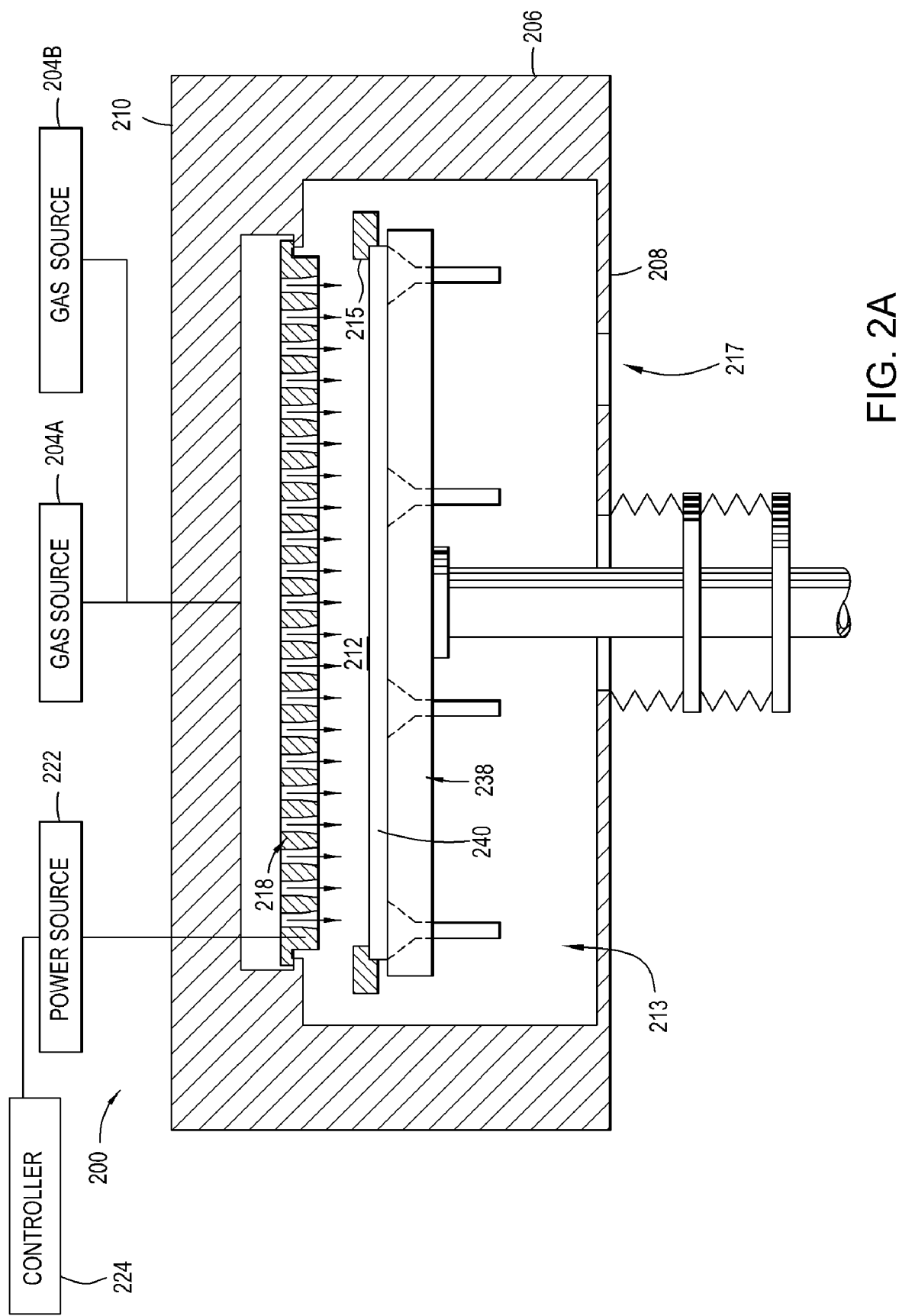
FIG. 2A is a schematic side view of a parallel plate PECVD system that may be used to perform embodiments of the invention.

FIG. 2A is a schematic side view of a parallel plate PECVD chamber 200 that may be used to perform embodiments of the invention. PECVD chamber 200 is available from AKT, a division of Applied Materials, Inc., Santa Clara, Calif.

PECVD chamber 200 is coupled to gas sources 204A, 204B and has walls 206, a bottom 208, and a lid assembly 210 that define the vacuum region 213 of PECVD chamber 200. A temperature-controlled substrate support assembly 238 is centrally disposed within the PECVD chamber 200 and is adapted to support a large-area substrate 240, or a plurality of conventional solar cell substrates (not shown) during SiN deposition. Because conventional solar cell substrates are 6 to 8 inches in diameter, a large number may be processed simultaneously in PECVD chamber 200.

The walls 206 support lid assembly 210. In some embodiments, lid assembly 210 may contain a pumping plenum (not shown) that couples vacuum region 213 to an upper exhaust port (not shown). In the embodiment shown, a lower exhaust port 217 may be located in the floor of PECVD chamber 200. Lid assembly 210 and substrate support assembly 238 substantially define a plasma-processing region 212, which is configured for plasma processing of large-area substrate 240 or a plurality of conventional solar cell substrates. Gas distribution plate 218, which is part of lid assembly 210, is configured to provide uniform distribution of process gases into plasma-processing region 212 for the processing of large-area substrate 240. A shadow ring 215 may be configured to rest on a peripheral region of the front surface of large-area substrate 240 during deposition in order to inhibit unwanted deposition on the backside and edge of large-area substrate 240.

Figure 2B:
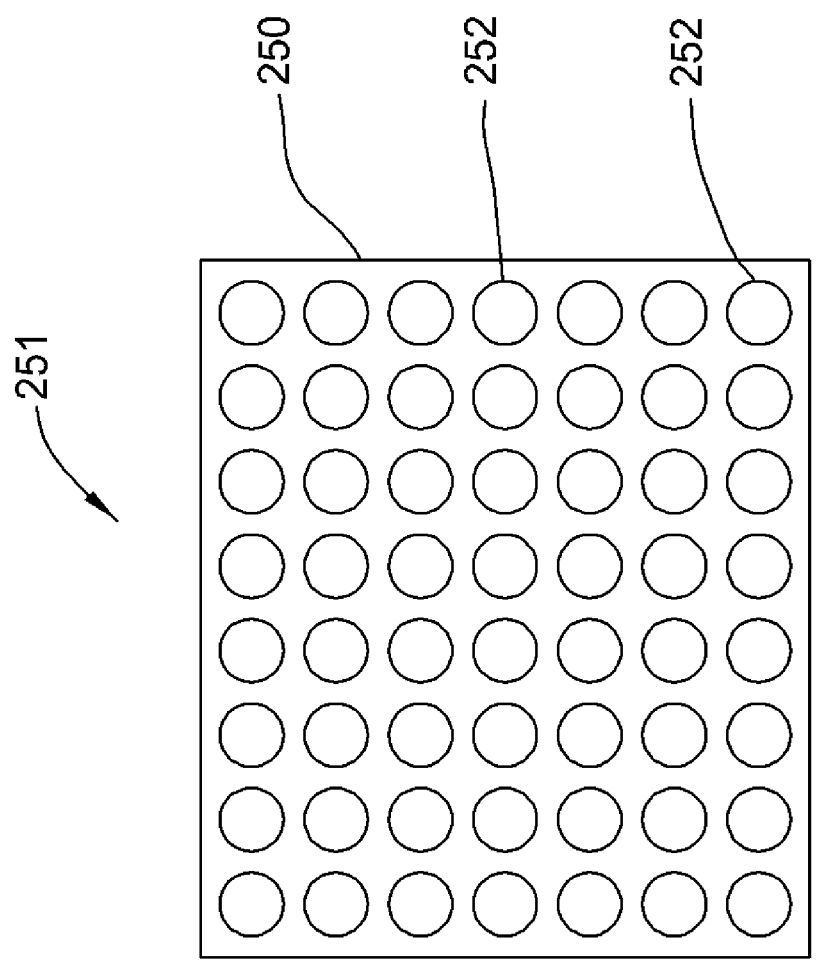
FIG. 2B is a schematic plan view of a substrate carrier supporting a batch of conventional solar cell substrates.

When conventional solar cell substrates are processed in PECVD chamber 200, a substrate carrier may be used for transferring a large number of substrates at one time therein. In this way, the conventional solar cell substrates are not loaded and unloaded individually from PECVD chamber 200, thereby increasing chamber throughput and lowering the processing cost per substrate. FIG. 2B is a schematic plan view of a substrate carrier 250 supporting a batch 251 of conventional solar cell substrates 252. In operation, substrate carrier 250 may be loaded with batch 251 of conventional solar cell substrates 252 "off-line," i.e., while PECVD chamber 200 is processing another batch of substrates, thereby reducing the idle time of PECVD chamber 200 to the time required to transfer one substrate carrier out of PECVD chamber 200 and one substrate carrier into PECVD chamber 200.

For a standard PECVD process, substrate support assembly 238 is electrically grounded and radio frequency (RF) power is supplied by a power source 222 to an electrode positioned within or near the lid assembly 210 to excite gases present in plasma-processing region 212, thereby producing plasma. Output of power source 222 is controlled by controller 224, which may include a microprocessor and plasma sensors. In the configuration shown in FIG. 2A, gas distribution plate 218 acts as the electrode. The magnitude of RF power for driving the chemical vapor deposition process is generally selected based on the size of the substrate and the particular deposition process in question. Embodiments of the invention contemplate the use of low frequency, high frequency, and very high frequency RF power for the generation of plasma. Low frequency plasma is largely in the 400 kHz regime, i.e., between about 100 kHz and 1 Mhz. High frequency RF power is usually about 13.56 MHz or 27 MHz, and VHF power is about 2.4 GHz. Gas sources 204A, 204B provide reactive gases to PECVD chamber 200, such as silane ($SiH_4$), ammonia ($NH_3$), and nitrogen ($N_2$), which are necessary for the PECVD process.

As noted above, embodiments of the invention contemplate methods for depositing a SiN layer that may act as a high-quality surface passivation/ARC layer for solar cells. The methods allow the tuning of the refractive index of a SiN layer, the reduction of the hydrogen concentration of a SiN layer, and control of the mass density of a SiN layer. Tuning the refractive index to a desired value, e.g., 2.08, provides an efficient ARC layer for a solar cell. Reducing the hydrogen concentration improves the passivation effect of the SiN layer. Controlling the mass density of the SiN layer prevents significant changes in the properties of the SiN layer after the firing process, such as thickness, refractive index, and hydrogen concentration, and improves the passivation effect of the SiN layer.

Figure 3:
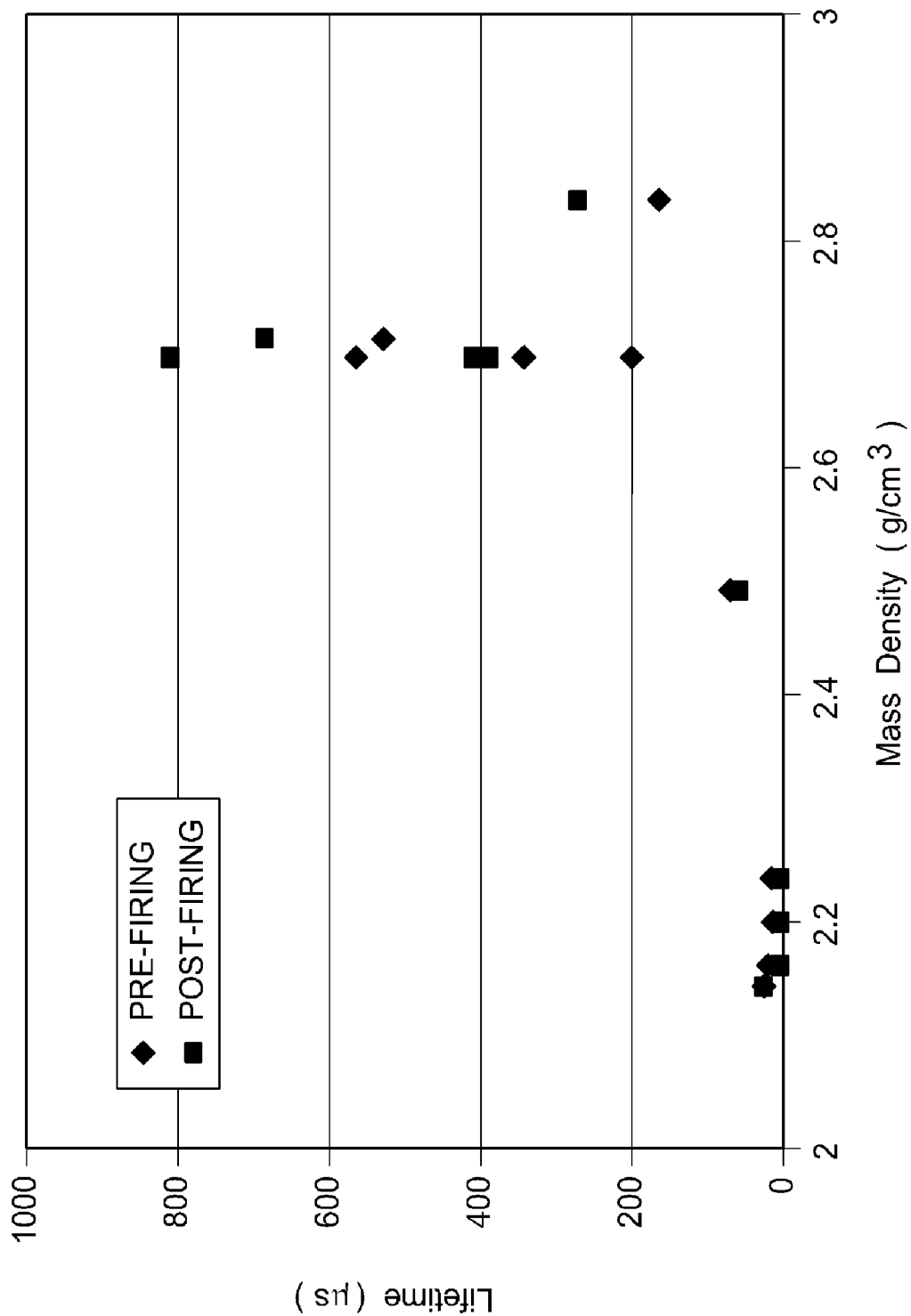
FIG. 3 includes lifetime data associated with SiN layers before and after the firing process has been performed on a crystalline silicon substrate.

FIG. 3 is a graph illustrating the effect of the mass density of a SiN layer on minority-carrier lifetime for a solar cell. FIG. 3 includes lifetime data associated with SiN layers before and after the firing process has been performed on a crystalline silicon substrate. The data presented in FIG. 3 indicate three characteristics of the relationship between mass density and lifetime. First, SiN films having a mass density of less than about 2.6 g/cm³ have unacceptably short lifetime values, i.e., less than 100 μs. Second, an optimal mass density for the SiN layer is evident, between about 2.6 and 2.8 g/cm³, wherein the lifetime values are substantially higher than for SiN layers having higher or lower mass density. Third, the firing process increases lifetime values significantly for SiN layers having an optimal mass density. Hence, mass density plays an important role in the passivation effect of a SiN layer.

Figure 4:
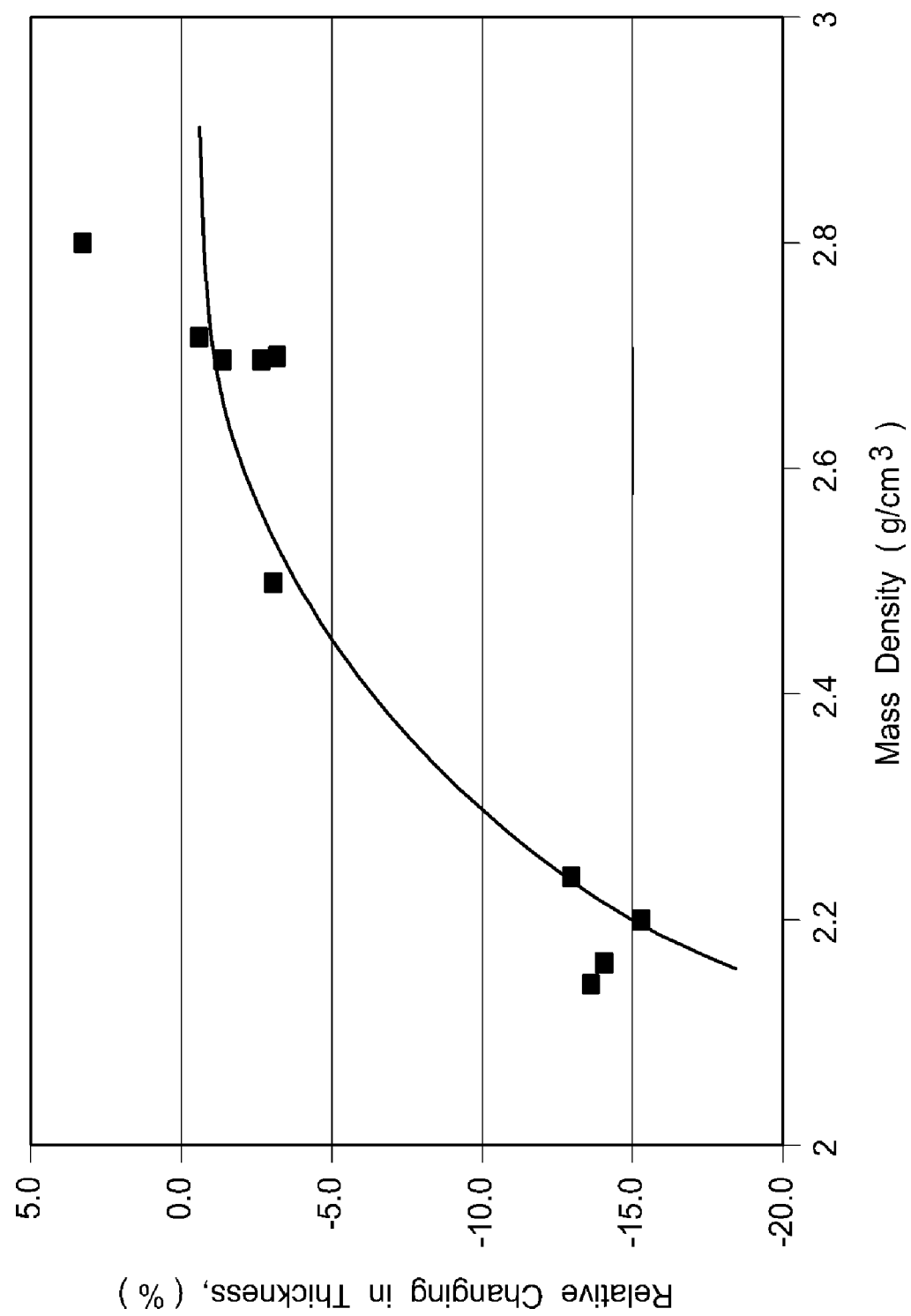
FIG. 4 is a graph illustrating the effect of the mass density of a SiN layer on the relative change in thickness of the layer after a firing process.
Figure 5:
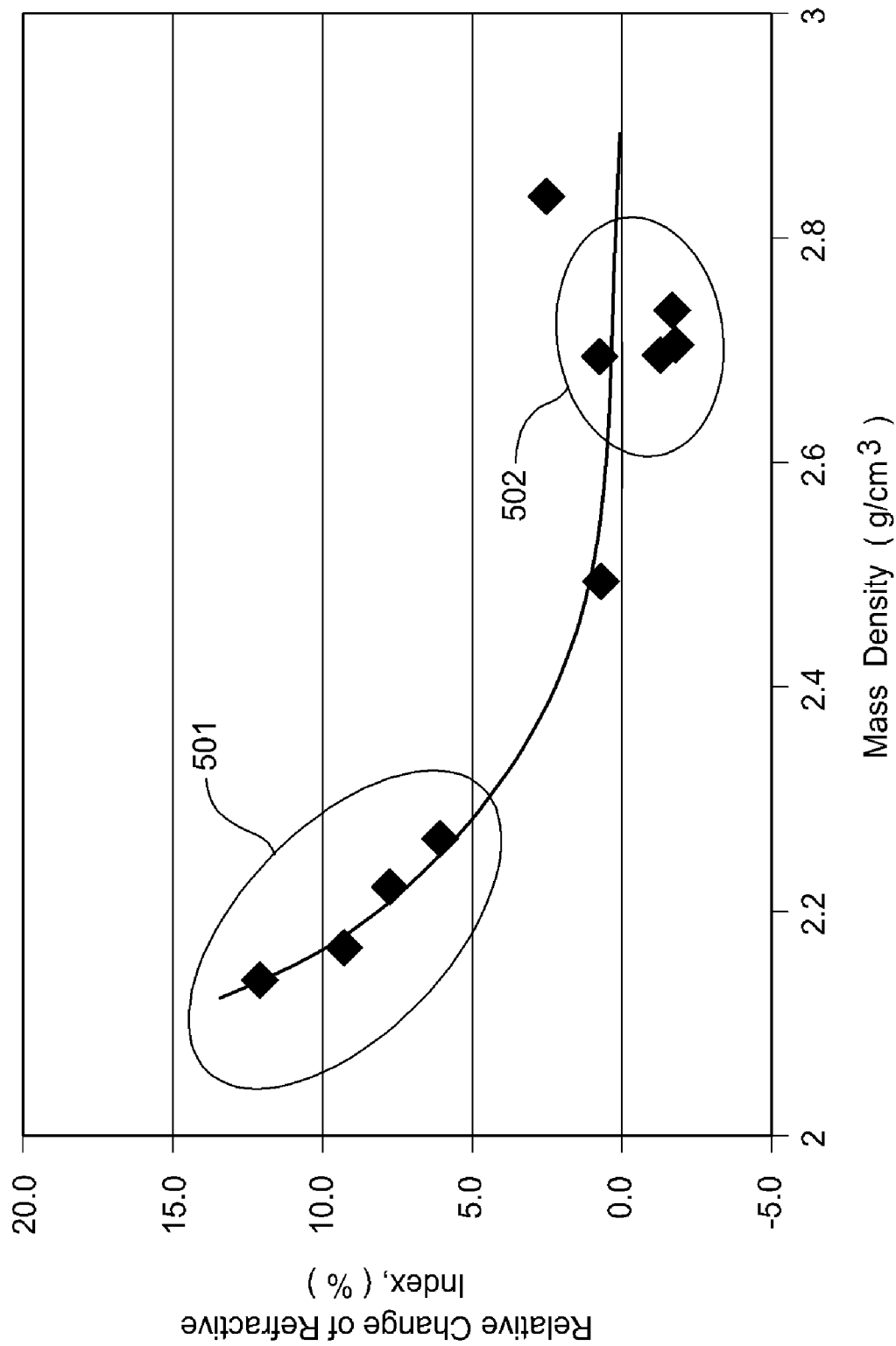
FIG. 5 is a graph illustrating the effect of the mass density of a SiN layer on the relative change in refractive index of the layer after a firing process.

Mass density has also been shown to affect the stability of SiN film properties. FIG. 4 is a graph illustrating the effect of the mass density of a SiN layer on the relative change in thickness of the layer after a firing process. Films having a mass density in the desired range of about 2.7 g/cm³ remain substantially unaffected by the firing process. In contrast, films having a sub-optimal mass density are shown to decrease significantly in thickness, i.e., up to 15%, during the firing process, indicating a substantial physical change. Similarly, mass density of a SiN layer has a significant impact on the relative change in refractive index of the layer caused by the firing process. FIG. 5 is a graph illustrating the effect of the mass density of a SiN layer on the relative change in refractive index of the layer after a firing process. The refractive index of a SiN film is shown to change substantially for SiN films having a sub-optimal mass density, i.e., data points 501, while SiN films in the desired range between 2.6 and 2.8 g/cm³, i.e., data points 502, remain substantially unaffected by the firing process. Variability of film thickness or refractive index is highly problematic for the manufacture of solar cells.

Further, mass density of SiN is also known to affect the hydrogen (H) concentration of the layer during the firing process. After firing, hydrogen concentration is reduced by as much as 60% for low density SiN layers, e.g., 2.2 g/cm³, while for higher density SiN layers, e.g., 2.7 g/cm³, loss of hydrogen is negligible. It is believed that a passivation layer having a low mass density, i.e., less than about 2.6 g/cm³, may allow too much hydrogen atom mobility during the firing process, so that hydrogen molecules ($H_2$) are formed which may diffuse out of the SiN layer. Conversely, it is believed that a passivation layer having a mass density higher than about 2.8 g/cm³ may not allow enough hydrogen mobility during the firing process, thus preventing hydrogen atoms from moving to the unpassivated surface and terminating the dangling bonds located there.

In light of the above, embodiments of the invention contemplate methods of deposition that control the mass density of a SiN film as well as the refractive index and hydrogen concentration of the film. These methods allow systems configured for processing large-area substrates to be used for the deposition of SiN films on solar cell substrates to produce high efficiency solar cells.

In one embodiment, a hydrogen dilution process is used during the deposition of a SiN layer to decrease the hydrogen (H) content of the deposited layer while improving the mass density of the layer. The inventors have determined that the addition of a substantial quantity of hydrogen gas ($H_2$) diluent to a conventional SiN precursor gas mixture may form a SiN layer on a substrate that has a mass density, a hydrogen (H) concentration, and a refractive index desirable for the passivation of a solar cell substrate. As defined herein, a "conventional precursor gas mixture" refers to precursor gas mixtures commonly used in PECVD systems configured for processing large-area substrates to form a SiN passivation layer on TFT's for flat panel displays. For a parallel plate, high frequency PECVD system, a conventional precursor gas mixture may include silane ($SiH_4$), ammonia ($NH_3$), and in some cases nitrogen ($N_2$). As contemplated by the inventors, the substantial quantity of hydrogen gas ($H_2$) diluent added to a conventional precursor gas mixture to perform a hydrogen dilution process is approximately equal to or greater than the total flow rate of the precursor gas mixture. In one example, a hydrogen dilution process for the deposition of a SiN layer for the passivation of a solar cell includes flowing 5.5 sccm of silane ($SiH_4$), 16 sccm of ammonia ($NH_3$), 40 sccm of nitrogen ($N_2$), and at least about 62 sccm of hydrogen gas ($H_2$), per liter of chamber volume.

Figure 6:
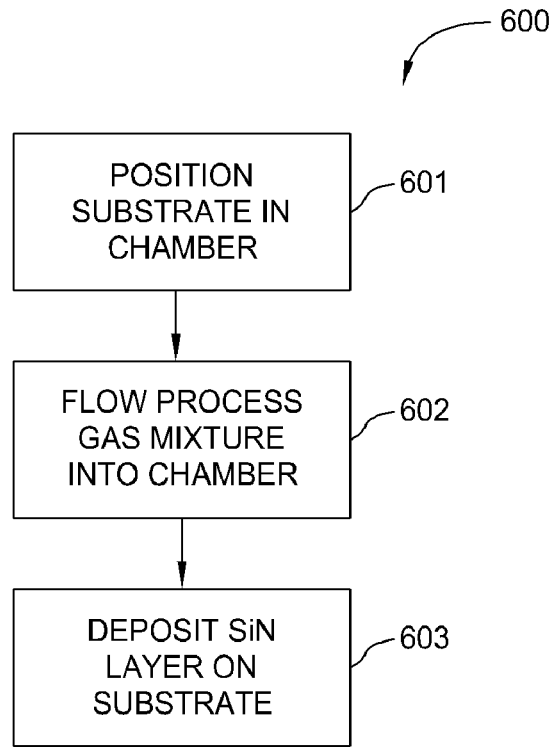
FIG. 6 is a flow chart summarizing a process sequence for depositing a hydrogenated SiN layer on a solar cell substrate using a hydrogen dilution process according to one embodiment of the invention.

FIG. 6 is a flow chart summarizing a process sequence 600 for depositing a hydrogenated SiN layer on a solar cell substrate using a hydrogen dilution process according to one embodiment of the invention.

In step 601, a substrate is positioned in a PECVD deposition chamber. In one example, the PECVD deposition chamber is a parallel-plate PECVD chamber configured with an electrode area suitable for processing large-area substrates, i.e., on the order of about 1 m² or larger, the substrate is positioned between the electrodes of the PECVD chamber, and the electrodes are spaced 1.100 inches apart. The chamber may be a low frequency or high frequency RF PECVD chamber. In this example, the substrate may be a large-area solar cell substrate, i.e., having an area up to approximately the same size as the electrode area of the chamber. Alternatively, the substrate may be substantially the same size as a conventional solar cell substrate, in which case a plurality of substrates may be processed simultaneously. In one aspect, the plurality of solar cell substrates may be loaded onto a substrate carrier, as described above in conjunction with FIG. 2B, thereby allowing all substrates to be loaded into the chamber at once, maximizing chamber throughput.

In step 602, a process gas mixture is flowed into the chamber. The process gas mixture includes a precursor gas mixture and a hydrogen gas ($H_2$) diluent. The hydrogen gas diluent may have a flow rate as high as approximately two times the flow rate of the precursor gas mixture. The precursor gas mixture may be a combination of silane ($SiH_4$) and nitrogen ($N_2$), silane and ammonia ($NH_3$), or silane, ammonia, and nitrogen. For the exemplary PECVD chamber described above in step 601, flow rates for a process gas mixture consisting of silane, ammonia, and hydrogen may be 3.5 sccm, 50 sccm, and 80 sccm, per liter of chamber volume, respectively. Flow rates for a process gas mixture consisting of silane, ammonia, nitrogen, and hydrogen may be 5 sccm, 16 sccm, 40 sccm, and 80 sccm, per liter of chamber volume, respectively. For a SiN deposition process in a PECVD process chamber configured with different geometry and/or process parameters than the example described herein, e.g., electrode spacing, RF power intensity, chamber pressure, etc., one skilled in the art can calculate suitable process gas flow rates for the deposition of a desired SiN layer based on the disclosure provided herein.

In step 603, a plasma is generated in the PECVD chamber to deposit a SiN layer on the substrate, wherein the SiN layer is suitable for use as a combined ARC and passivation layer for a solar cell. Namely, the SiN layer so deposited has a mass density of between about 2.6 and 2.8 g/cm³, a refractive index of between about 2.0 and 2.2, and a hydrogen (H) concentration of between about 5 atomic % and 15 atomic %. For the exemplary PECVD chamber described above in step 601, a chamber pressure of 1.5 Torr may be maintained in the chamber and an RF power intensity of 0.54 W/cm² at a frequency of 13.56 MHz may be applied to the electrodes of the chamber to generate the plasma. Alternatively, low frequency RF power, e.g., 400 kHz, may instead be applied to the electrodes. When step 603 includes a lower frequency RF process, one skilled in the art, upon reading the disclosure provided herein, can determine suitable process parameters to deposit a suitable SiN ARC/passivation layer, including chamber pressure, electrode spacing, and RF power intensity.

It is noted that there is no single target value for the hydrogen (H) concentration of a SiN ARC/passivation layer when the layer is deposited by process sequence 600. The optimal hydrogen concentration for a SiN ARC/passivation layer varies depending on the process and chamber used to deposit the layer. For example, for a SiN layer deposited with the exemplary PECVD chamber and deposition process described in process sequence 600, the hydrogen concentration desired for optimal passivation, mass density, and refractive index is approximately 12 atomic %, whereas for other SiN ARC/passivation layers, the optimal hydrogen concentration may be higher or lower. One skilled in the art can, upon reading the disclosure herein, determine the optimum hydrogen concentration for a particular SiN film. In any event, the hydrogen concentration present in a SiN layer deposited by process sequence 600, i.e., 5-15 atomic %, is substantially lower than that present in SiN films deposited without hydrogen dilution, i.e., 25-30 atomic %. As noted above, when no hydrogen dilution is included with the precursor gas mixture, a parallel plate, large-area PECVD chamber cannot deposit a SiN layer with less than about 25 atomic % hydrogen concentration, which results in unacceptably low lifetime values for charge carriers after firing of the SiN layer. For example, a SiN ARC/passivation layer deposited using the exemplary PECVD chamber and deposition process described above in process sequence 600 has demonstrated a charge carrier lifetime of more than 400 μs. In contrast, a SiN layer formed by an identical process but without hydrogen dilution has a charge carrier lifetime two orders of magnitude lower, i.e., 3 μs.

The inventors have determined that the mass density and hydrogen (H) concentration of a PECVD-deposited SiN layer may be improved by eliminating ammonia ($NH_3$) from a conventional precursor gas mixture, while the refractive index may be controlled by tuning other process parameters already known in the art. Hence, in another embodiment, ammonia is eliminated from a conventional precursor gas mixture, so that the precursor gas mixture includes silane ($SiH_4$) and nitrogen ($N_2$) as source gases. In so doing, the hydrogen concentration of the deposited SiN layer may have suitable film properties for use as an ARC/passivation layer, even when deposited by a parallel plate, large-area PECVD chamber.

Figure 7:
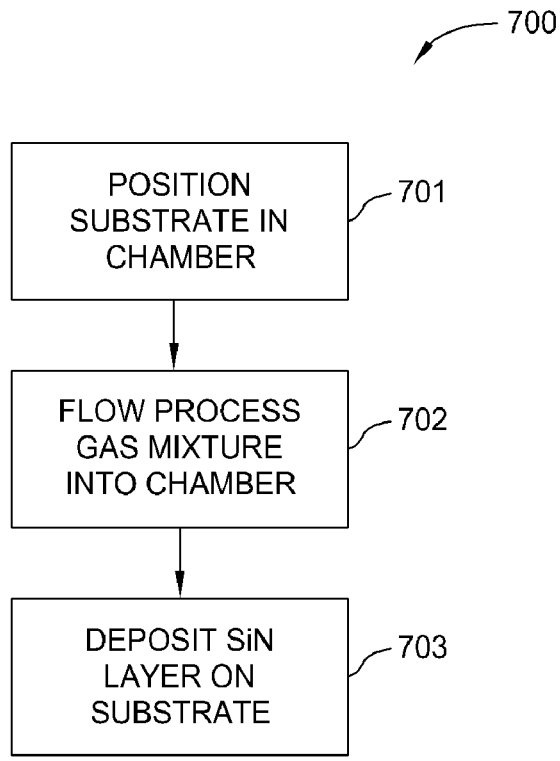
FIG. 7 is a flow chart summarizing a process sequence for depositing a hydrogenated SiN layer on a solar cell substrate using an ammonia-free precursor gas mixture according to one embodiment of the invention.

FIG. 7 is a flow chart summarizing a process sequence 700 for depositing a hydrogenated SiN layer on a solar cell substrate using an ammonia-free precursor gas mixture according to one embodiment of the invention.

In step 701, a substrate is positioned in a PECVD deposition chamber. The substrate and deposition chamber may be substantially the same as described in step 601 of the previous embodiment. A substrate carrier may be used to position a plurality of substrates in the chamber.

In step 702, a process gas mixture is flowed into the chamber. The process gas mixture includes silane ($SiH_4$) and nitrogen ($N_2$) as precursor gases, and is free of ammonia ($NH_3$). The process gas mixture, according to one aspect, may have substantially the same flow rate of nitrogen and silane as the nitrogen and silane flow rates of a conventional SiN process gas mixture. For example, a conventional SiN process gas mixture, i.e., one commonly used in PECVD systems for forming a SiN passivation layer on large-area substrates, may consist of 5.5 sccm of silane, 16 sccm of ammonia, and 40 sccm of nitrogen, per liter of chamber volume. Hence, a process gas mixture contemplated by the invention may consist of 5.5 sccm of silane and 40 sccm of nitrogen, per liter of chamber volume. The process gas mixture, according to another aspect, may have a substantially higher nitrogen flow rate relative to the flow rate of silane, when compared to a corresponding conventional SiN process gas mixture. Hence, another process gas mixture contemplated by the invention may consist of 3.5 sccm of silane and 95 sccm of nitrogen, per liter of chamber volume. As noted above, one skilled in the art can calculate suitable process gas flow rates for the deposition of a desired SiN layer based on the disclosure provided herein, when a PECVD process chamber is configured with different geometry and/or process parameters are used than the example described herein.

In step 703, a plasma is generated in the PECVD chamber to deposit a SiN layer on the substrate in a manner substantially the same as described above in step 603 of the previous embodiment. As with the previous embodiment, the SiN layer so deposited is suitable for use as a combined ARC and passivation layer for a solar cell.

The methods described above enable the use of large area PECVD systems for depositing SiN ARC/passivation layers on solar cell substrates, thereby taking advantage of the superior deposition rate affected by such systems. A further increase in deposition rate of a SiN ARC/passivation layer may be realized by forming an ARC/passivation layer as a 2-layer stack, or "dual stack" film.

Figure 8:
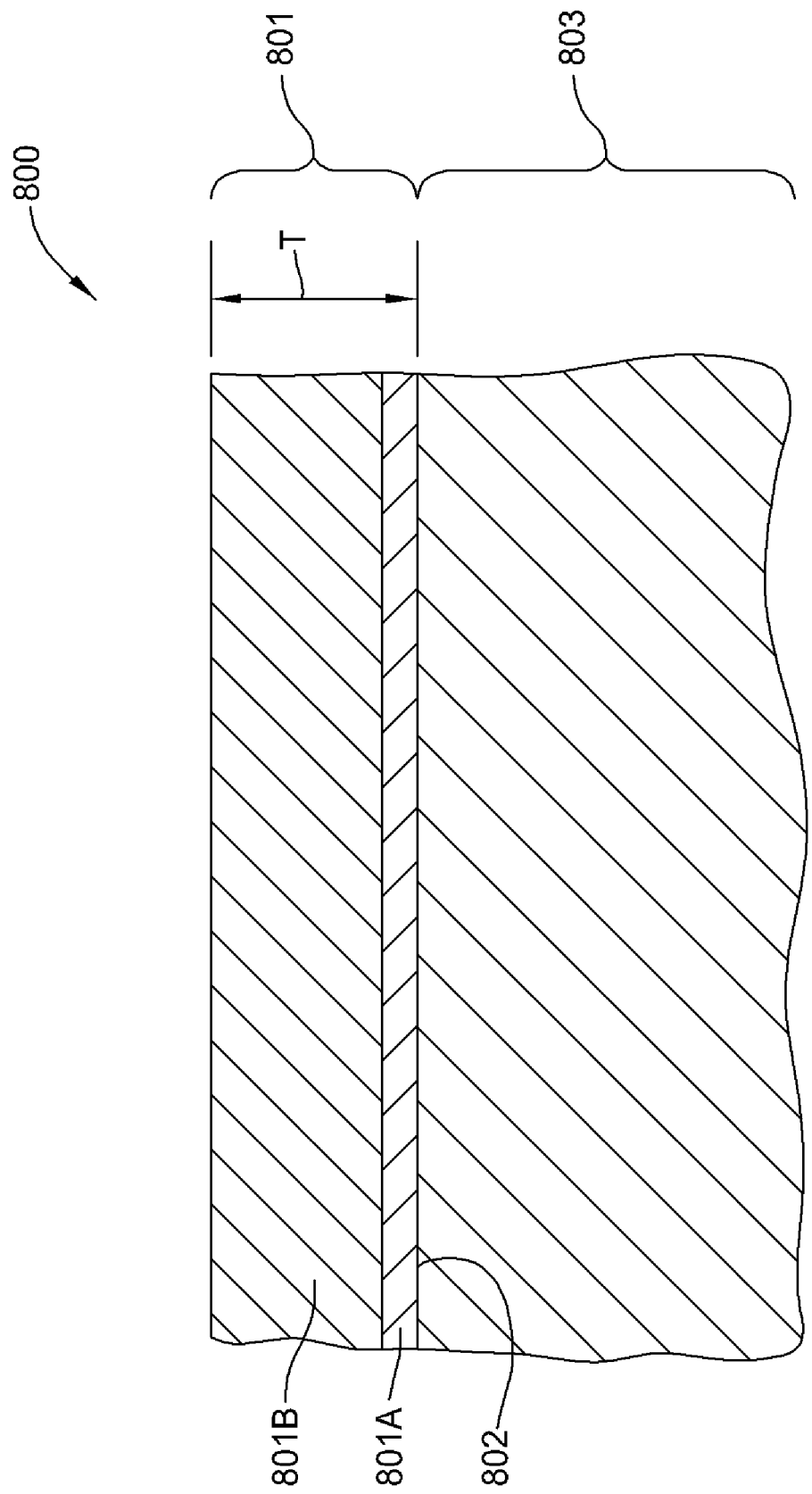
FIG. 8 is a schematic side view of a solar cell having a dual stack film formed on the light-receiving surface of an emitter region.

FIG. 8 is a schematic side view of a solar cell 800 having a dual stack film 801 formed on the light-receiving surface 802 of an emitter region 803. Dual stack film 801 includes an interface layer 801A and a bulk SiN layer 801 B. Interface layer 801A is a relatively thin layer of SiN that is deposited on light-receiving surface 802 and has an optimal hydrogen (H) concentration for passivating emitter region 803. In general, interface layer 801A makes up a small fraction of the total thickness T of dual stack film 801. In one example, interface layer 801A may be between about 10-20 nm thick. Bulk SiN layer 801B is a relatively thick layer of SiN that is deposited on interface layer 801A and may contain a hydrogen concentration that is not optimal for passivating a solar cell substrate, e.g., 25 atomic % and higher. In one example, bulk SiN layer 801B may be between about 75 and 85 nm thick. In another example, bulk SiN layer 801B may make up approximately 85% of the overall thickness of dual stack film 801. Because the passivation effect primarily takes place at the interface between light-receiving surface 802 and its passivation layer, in this case dual stack film 801, higher concentrations of hydrogen in the upper regions of the passivation layer, e.g., bulk SiN layer 801 B, do not adversely affect charge carrier lifetime of solar cell 800. Therefore, the majority of a SiN passivation layer may have an undesirable hydrogen concentration without reducing solar cell efficiency, as long as an interface layer having an optimal hydrogen concentration, e.g., interface layer 801A, is present to provide the necessary passivation effect.

The inventors have determined that the deposition rate of conventional SiN layers, i.e., SiN passivation layers formed on TFT's and having higher concentrations of hydrogen (H), is substantially higher than the deposition rate of SiN layers more suitable for passivation of solar cells. Therefore, a SiN dual stack film on a solar cell substrate may form a passivation layer that can be deposited substantially faster than a monolithic SiN passivation layer, thereby improving throughput and decreasing solar cell cost.

Figure 9:
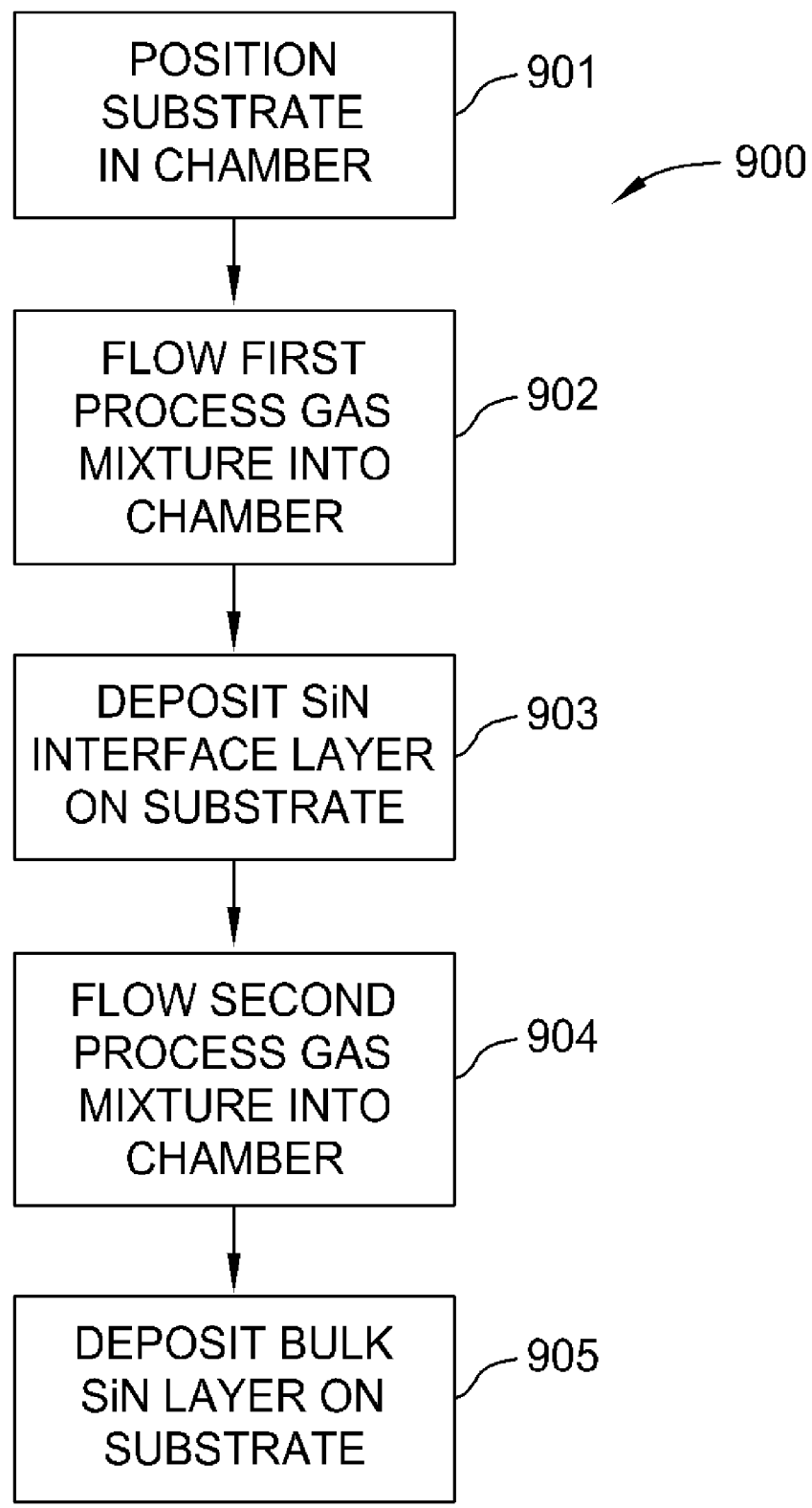
FIG. 9 is a flow chart summarizing a process sequence for depositing a SiN dual stack film on a solar cell substrate according to one embodiment of the invention.

FIG. 9 is a flow chart summarizing a process sequence 900 for depositing a SiN dual stack film on a solar cell substrate according to one embodiment of the invention.

In step 901, a substrate is positioned in a PECVD deposition chamber. The substrate and deposition chamber may be substantially the same as described in steps 601, 701 of the previous embodiments. A substrate carrier may be used to position a plurality of substrates in the chamber.

In step 902, a first process gas mixture is flowed into the chamber. The process gas mixture may be a gas mixture described above in step 602 or step 702 of the previous embodiments.

In step 903, a plasma is generated in the PECVD chamber to deposit a SiN interface layer on the substrate in a manner substantially the same as described above in steps 603, 703 of the previous embodiments. As with the previous embodiments, the SiN layer so deposited is suitable for use as a combined ARC and passivation layer for a solar cell. Unlike the previous embodiments, the interface layer may only be 10-20 nm thick.

In step 904, flow of the first process gas mixture is stopped and a second process gas mixture is flowed into the chamber. The second process gas mixture may be a conventional SiN process gas mixture, i.e., one commonly used in PECVD systems for forming a SiN passivation layer on large-area substrates such as flat panel displays. In one example, the second process gas mixture may consist of 5.5 sccm of silane ($SiH_4$), 16 sccm of ammonia ($NH_3$), and 40 sccm of nitrogen ($N_2$), per liter of chamber volume. Optionally, plasma may be extinguished in the PECVD chamber after flow of the first process gas mixture is stopped and prior to the introduction of the second process gas mixture. In this case, the first process gas mixture may be substantially purged from the PECVD chamber before the second process gas mixture is flowed into the chamber.

In step 905, a bulk SiN layer is deposited on the interface layer to form a dual stack SiN ARC/passivation layer on the substrate. In this way, the majority of the SiN passivation layer may be deposited by a substantially faster process without affecting the quality of solar cell passivation. If plasma has been extinguished in the PECVD chamber prior to the introduction of the second process gas mixture, then plasma is first re-ignited to enable deposition of the bulk SiN layer.

While the foregoing is directed to embodiments of the present invention, other and further embodiments of the invention may be devised without departing from the basic scope thereof, and the scope thereof is determined by the claims that follow.

What is claimed is:

1. A method of forming a silicon nitride layer on a solar cell substrate, comprising:
   positioning at least one solar cell substrate in a processing chamber;
   flowing a process gas mixture into the processing chamber; and
   generating plasma in the processing chamber to deposit a first hydrogenated silicon nitride layer on the substrate, wherein the process gas mixture includes a total precursor gas mixture and a hydrogen gas (H2) diluent, the flow rate of the hydrogen gas diluent being equal to or greater than the flow rate of the total precursor gas mixture.

2. The method of claim 1, wherein the total precursor gas mixture is selected from the group of gas mixtures consisting of silane ($SiH_4$) and nitrogen ($N_2$); silane, nitrogen, and ammonia ($NH_3$); and silane and ammonia.

3. The method of claim 1, wherein the positioning a solar cell substrate in a processing chamber comprises positioning the at least one substrate between first and second electrodes, the first and second electrodes being configured substantially parallel to each other.

4. The method of claim 1, wherein the generating plasma further comprises exciting the process gases with radio frequency energy having a frequency of 1-30 MHz.

5. The method of claim 1, wherein the hydrogenated silicon nitride layer contains less than about 15 atomic % hydrogen (H).

6. The method of claim 5, further comprising flowing a second process gas mixture into the processing chamber to deposit a second hydrogenated silicon nitride layer on the first hydrogenated silicon nitride layer, wherein the second process gas mixture is selected from the group of gas mixtures consisting of silane ($SiH_4$) and nitrogen ($N_2$); silane, nitrogen, and ammonia ($NH_3$); and silane and ammonia.

7. The method of claim 6, wherein the generating plasma in the processing chamber to deposit a first hydrogenated silicon nitride layer comprises generating plasma in the processing chamber to deposit a first hydrogenated silicon nitride layer having a thickness of about 10-20 nm.

8. The method of claim 1, wherein the positioning at least one solar cell substrate in a processing chamber comprises:
   placing a plurality of solar cell substrates on a substrate carrier; and
   transferring the substrate carrier into the processing chamber.

9. A method of forming a silicon nitride layer on a solar cell substrate, comprising:
   positioning at least one solar cell substrate in a processing chamber between first and second electrodes, the first and second electrodes being configured parallel to each other;
   flowing a process gas mixture into the processing chamber; and
   generating plasma in the processing chamber to deposit a first hydrogenated silicon nitride layer on the substrate, wherein the process gas mixture includes a total precursor gas mixture and a hydrogen gas (H2) diluent, the flow rate of the hydrogen gas diluent being equal to or greater than the flow rate of the total precursor gas mixture.

10. The method of claim 9, wherein the total precursor gas mixture is selected from the group of gas mixtures consisting of silane ($SiH_4$) and nitrogen ($N_2$); silane, nitrogen, and ammonia ($NH_3$); and silane and ammonia.

11. The method of claim 9, wherein the generating plasma further comprises exciting the process gases with radio frequency energy having a frequency of 1-30 MHz.

12. The method of claim 9, wherein the first hydrogenated silicon nitride layer contains less than about 15 atomic % hydrogen (H).

13. The method of claim 12, further comprising flowing a second process gas mixture into the processing chamber to deposit a second hydrogenated silicon nitride layer on the first hydrogenated silicon nitride layer, wherein the second process gas mixture is selected from the group of gas mixtures consisting of silane ($SiH_4$) and nitrogen ($N_2$); silane, nitrogen, and ammonia ($NH_3$); and silane and ammonia.

14. The method of claim 9, wherein the positioning at least one solar cell substrate in a processing chamber comprises:
   placing a plurality of solar cell substrates on a substrate carrier; and
   transferring the substrate carrier into the processing chamber.

* * * * *